United States Patent
Hassner et al.

(10) Patent No.: US 6,553,536 B1
(45) Date of Patent: Apr. 22, 2003

(54) SOFT ERROR CORRECTION ALGEBRAIC DECODER

(75) Inventors: Martin Aureliano Hassner, Mountain View, CA (US); Richard Michael Hamilton New, San Jose, CA (US); Arvind Motibhai Patel, San Jose, CA (US); Tetsuya Tamura, Kanagawa (JP); Barry Marshall Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 09/611,872

(22) Filed: Jul. 7, 2000

(51) Int. Cl.$^7$ ............................................. H03M 13/00
(52) U.S. Cl. ...................................... 714/780; 714/781
(58) Field of Search ................................. 714/780, 781, 714/777, 784, 785, 786, 794, 746, 752, 758, 761, 762, 795; 375/240.7, 262, 265, 341

(56) References Cited

U.S. PATENT DOCUMENTS

| | | | |
|---|---|---|---|
| 4,763,331 A | | 8/1988 | Matsumoto ................... 371/37 |
| 4,821,268 A | | 4/1989 | Berlekamp ................... 371/37 |
| 5,297,153 A | * | 3/1994 | Baggen et al. .............. 714/761 |
| 5,428,628 A | | 6/1995 | Hassner et al. ............. 371/37.1 |
| 5,684,810 A | * | 11/1997 | Nakamura et al. .......... 714/755 |
| 6,421,807 B1 | * | 7/2002 | Nakamura et al. .......... 714/781 |
| 6,449,746 B1 | * | 9/2002 | Troung et al. .............. 714/784 |

OTHER PUBLICATIONS

Japanese Publication No. 09–093142, Published Apr. 4, 1997, with English Abstract.
Japanese Publication No. 07–254860, Pub. Oct. 3, 1995, with English Abstract.
Japanese Publication No. 10–163882, Pub. Jun. 19, 1998, with English Abstract.
Kamiya, N., "On Acceptance Criterion for Efficient Successive Errors–and–Erasures Decoding of Reed–Solomon and BCH Codes," IEEE Transactions on Information Theory, vol. 43, No. 5, Sep. 1997, pp. 1477–1488.

\* cited by examiner

Primary Examiner—Christine T. Tu
(74) Attorney, Agent, or Firm—Samuel A. Kassatly

(57) ABSTRACT

A soft error correction algebraic decoder and an associated method use erasure reliability numbers to derive error locations and values. More specifically, symbol reliability numbers from a maximum likelihood (ML) decoder as well as a parity check success/failure from inner modulation code symbols are combined by a Reed-Solomon decoder in an iterative manner, such that the ratio of erasures to errors is maximized. The soft error correction (ECC) algebraic decoder and associated method decode Reed Solomon codes using a binary code and detector side information. The Reed Solomon codes are optimally suited for use on erasure channels. A threshold adjustment algorithm qualifies candidate erasures based on a detector error filter output as well as modulation code constraint success/failure information, in particular parity check or failure as current modulation codes in disk drive applications use parity checks. This algorithm creates fixed erasure inputs to the Reed Solomon decoder. A complementary soft decoding algorithm of the present invention teaches the use of a key equation solver algorithm that calculates error patterns obtained as a solution to a weighted rational interpolation problem with the weights given by the detector side information.

29 Claims, 9 Drawing Sheets

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| 0 | 0 | $a^{14}$ | 0 | $a^{10}$ | 0 | $a^3$ | 0 | $a^5$ | 0 | 0 | 0 | 0 | 0 | 1 |

W: CODEWORD

FIG. 6

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| 0.8 | 0.9 | 0.6 | 0.8 | 0.4 | 0.9 | 0.2 | 0.9 | 0.8 | 0.9 | 0.9 | 1.0 | 0.7 | 1.0 | 1.0 |

410 ↗

BYTE RELIABILITY NUMBERS

FIG. 7

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| $a^0$ | $a^1$ | $a^2$ | $a^3$ | $a^4$ | 0 | $a^6$ | 0 | $a^8$ | 0 | 0 | 0 | $a^{12}$ | 0 | 0 |

420 ↗

CANDIDATE ERASURE LOCATIONS

FIG. 8

| $0$ | $a^8$ | $0$ | $a^{10}$ | $a^{12}$ | $a^8$ | $a^3$ | $a^{11}$ |

SYNDROMES
FIG. 9

| 1 | 8 | 3 | 0 | 12 | 2 | 4 | 6 |
| 0.9 | 0.8 | 0.8 | 0.8 | 0.7 | 0.6 | 0.4 | 0.2 |

SORTED BYTE
RELIABILITY NUMBERS
FIG. 10

| 1 | 8 | 3 | 0 | 12 | 2 | 4 | 6 |
| $a^1$ | $a^8$ | $a^3$ | $a^0$ | $a^{12}$ | $a^2$ | $a^4$ | $a^6$ |

SORTED CANDIDATE
ERASURE LOCATIONS
FIG. 11

405

SOFT ERROR CORRECTION ALGEBRAIC DECODER

FIELD OF THE INVENTION

The present invention relates to the field of data storage, and particularly to systems and methods employing a soft error correction algebraic decoder. More specifically, according to this invention, byte reliability numbers from a maximum likelihood (ML) decoder as well as a parity check success/failure from inner modulation code symbols are combined by a Reed-Solomon decoder in an iterative manner, such that the ratio of erasures to errors is maximized, for the purpose of minimizing the number of required check bytes.

BACKGROUND OF THE INVENTION

The use of cyclic error correcting codes in connection with the storage of data in storage devices is well established and is generally recognized as a reliability requirement for the storage system. Generally, the error correcting process involves the processing of syndrome bytes to determine the location and value of each error. Non-zero syndrome bytes result from the exclusive-ORing of error characters that are generated when data is written on the storage medium.

The number of error correction code (ECC) check characters employed depends on the desired power of the code. As an example, in many present day ECC systems used in connection with the storage of 8-bit bytes in a storage device, two check bytes are used for each error to be corrected in a codeword having a length of at most 255 byte positions. Thus, for example, six check bytes are required to correct up to three errors in a block of data having 249 data bytes and six check bytes. Six distinctive syndrome bytes are therefore generated in such a system. If there are no errors in the data word comprising the 255 bytes read from the storage device, then the six syndrome bytes are the all zero pattern. Under such a condition, no syndrome processing is required and the data word may be sent to the central processing unit. However, if one or more of the syndrome bytes are non-zero, then syndrome processing involves the process of identifying the location of the bytes in error and further identifying the error pattern for each error location.

The underlying mathematical concepts and operations involved in normal syndrome processing operations have been described in various publications. These operations and mathematical explanations generally involve first identifying the location of the errors by use of what has been referred to as the "error locator polynomial". The overall objective of the mathematics involved employing the error locator polynomial is to define the locations of the bytes in error by using only the syndrome bytes that are generated in the system.

The error locator polynomial has been conventionally employed as the start of the mathematical analysis to express error locations in terms of syndromes, so that binary logic may be employed to decode the syndrome bytes into first identifying the locations in error, in order to enable the associated hardware to identify the error patterns in each location. Moreover, error locations in an on-the-fly ECC used in storage or communication systems are calculated as roots of the error locator polynomial.

Several decoding techniques have been used to improve the decoding performance. One such technique is minimum distance decoding whose error correcting capability relies only upon algebraic redundancy of the code. However, the minimum distance decoding determines a code word closest to a received word on the basis of the algebraic property of the code, and the error probability of each digit of the received word does not attribute to the decoding. That is, the error probability of respective digits are all regarded as equal, and the decoding becomes erroneous when the number of error bits exceeds a value allowed by the error correcting capability which depends on the code distance.

Another more effective decoding technique is the maximum likelihood decoding according to which the probabilities of code words regarded to have been transmitted are calculated using the error probability of each bit, and a code word with the maximum probability is delivered as the result of decoding. This maximum likelihood decoding permits the correction of errors exceeding in number the error correcting capability. However, the maximum likelihood decoding technique is quite complex and requires significant resources to implement. In addition, the implementation of the maximum likelihood decoding technique typically disregards valuable data such as bit reliability information.

However, in conventional decoding schemes the Reed Solomon code is not optimized to create the maximum number of erasures for given reliability/parity information, mainly due to the fact that such information is largely unavailable to the Reed Solomon decoder. Furthermore, the key equation solvers implemented in conventional decoders are not designed to solve a weighted rational interpolation problem.

Thus, there is still a need for a decoding method that reduces the complexity and resulting latency of the likelihood decoding technique, without significantly affecting its performance, and without losing bit reliability information.

Attempts to render the decoding process more efficient have been proposed. Reference is made to N. Kamiya, "On Acceptance Criterion for Efficient Successive Errors-and-Erasures Decoding of Reed-Solomon and BCH Codes," IEEE Transactions on Information Theory, Vol. 43, No. Sep. 5, 1997, pages 1477–1488. However, such attempts generally require multiple recursions to calculate the error locator and evaluator polynomials, thus requiring redundancy in valuable storage space. In addition, such attempts typically include a key equation solver whose function is limited to finite field arithmetic, thus requiring a separate module to perform finite precision real arithmetic, which increases the implementation cost of the decoding process.

Therefore, there is still an unsatisfied need for a more efficient decoding algorithm that provides most likely erasure and error locator polynomials from a set of candidate erasures generated by a full Generalized Minimum Distance (GMD) decoding algorithm, without locating the roots of all candidate error locator polynomials, and which is implementable with minimal redundancy in the storage space.

SUMMARY OF THE INVENTION

In accordance with the present invention, a soft error correction algebraic decoder and an associated method use erasure reliability numbers to derive error locations and values. More specifically, symbol reliability numbers from a maximum likelihood (ML) decoder as well as a parity check success/failure from inner modulation code symbols are combined by a Reed-Solomon decoder in an iterative manner, such that the ratio of erasures to errors is maximized.

According to one feature of the present invention the decoder requires one recursion to calculate the error locator and evaluator polynomials, by calculating both of these polyonimals sequentially, thus minimizing the redundancy in the storage space.

The above and other features of the present invention are realized by a soft error correction (ECC) algebraic decoder and associated method for decoding Reed Solomon codes using a binary code and detector side information. The Reed Solomon codes are optimally suited for use on erasure channels. One feature of the present invention is to employ a key equation solver capable of performing both finite field arithmetic and finite precision real arithmetic to reduce the implementation cost of the decoding process.

According to one feature of the invention, a threshold adjustment algorithm qualifies candidate erasures based on a detector error filter output as well as modulation code constraint success/failure information, in particular parity check or failure as current modulation codes in disk drive applications use parity checks. This algorithm creates fixed erasure inputs to the Reed Solomon decoder.

A complementary soft decoding algorithm of the present invention teaches the use of a key equation solver algorithm that calculates error patterns obtained as a solution to a weighted rational interpolation problem with the weights given by the detector side information.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 6 illustrates an exemplary codeword comprised of 15 bytes at 15 byte locations to be processed by the soft error correction decoder of FIG. 4;

FIG. 7 illustrates exemplary byte reliability numbers for the codeword of FIG. 6, to be processed by the soft error correction decoder of FIG. 4;

FIG. 8 illustrates exemplary candidate erasure locations for the codeword of FIG. 6, to be processed by the soft error correction decoder of FIG. 4;

FIG. 9 illustrates exemplary syndromes for the codeword of FIG. 6, to be processed by the soft error correction decoder of FIG. 4;

FIG. 10 illustrates the exemplary byte reliability numbers of FIG. 7, after they have been sorted in descending order by the soft error correction decoder of FIG. 4; and FIG. 11 illustrates the exemplary candidate erasure locations of FIG. 8, after they have been sorted according to their reliability values by the soft error correction decoder of FIG. 4.

DETAILED DESCRIPTION OF THE INVENTION

Figure 1:
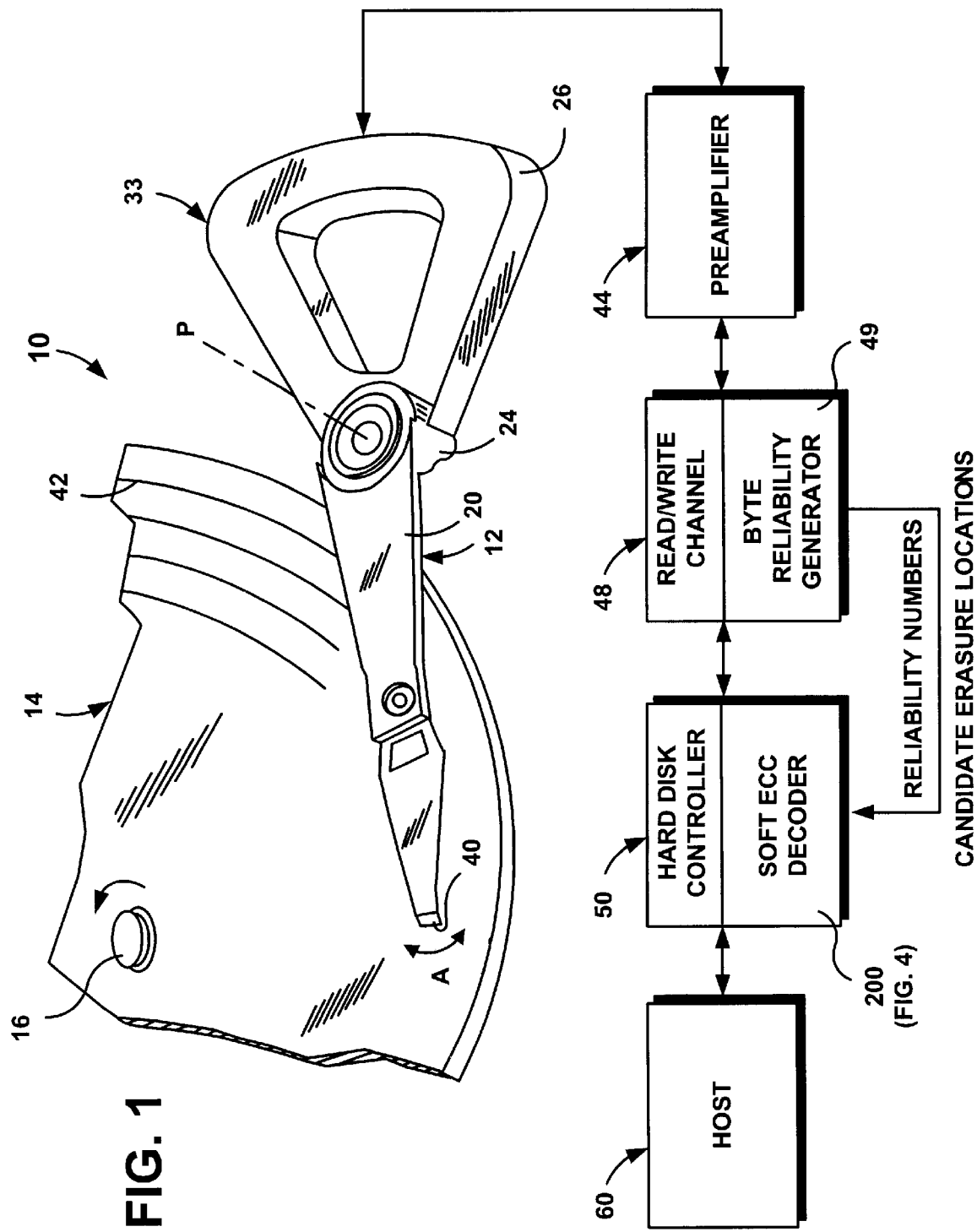
FIG. 1 is a schematic illustration of a data storage system such as a disk drive, that implements an on-the-fly algebraic error correction code (ECC) according to the present invention.

FIG. 1 illustrates a disk drive 10 comprised of a head stack assembly 12 and a stack of spaced apart magnetic, optical and/or MO data storage disks or media 14 that are rotatable about a common shaft 16. The head stack assembly 12 includes a number of actuator arms 20 that extend into spacings between the disks 14, with only one disk 14 and one actuator arm 20 being illustrated for simplicity of illustration. The disk drive 10 further includes a preamplifier 44, a read/write channel 48 that includes a byte reliability generator 49, and a hard disk controller 50 that includes a soft error correction algebraic decoder 200 of the present invention.

The head stack assembly 12 also includes an E-shaped block 24 and a magnetic rotor 26 attached to the block 24 in a position diametrically opposite to the actuator arms 20. The rotor 26 cooperates with a stator (not shown) for the actuator arms 20 to rotate in a substantially radial direction, along an arcuate path in the direction of an arrow A. Energizing a coil of the rotor 26 with a direct current in one polarity or the reverse polarity causes the head stack assembly 12, including the actuator arms 20, to rotate around axis P in a direction substantially radial to the disks 14. A head disk assembly 33 is comprised of the disks 14 and the head stack assemblies 12.

A transducer head 40 is mounted on the free end of each actuator arm 20 for pivotal movement around axis P. The magnetic rotor 26 controls the movement of the head 40 in a radial direction, in order to position the head 40 in registration with data information tracks or data cylinders 42 to be followed, and to access particular data sectors on these tracks 42.

Numerous tracks 42, each at a specific radial location, are arrayed in a concentric pattern in a magnetic medium of each surface of data disks 14. A data cylinder includes a set of corresponding data information tracks 42 for the data surfaces of the stacked disks 14. Data information tracks 42 include a plurality of segments or data sectors, each containing a predefined size of individual groups of data records that are saved for later retrieval and updates. The data information tracks 42 can be disposed at predetermined positions relative to a servo reference index.

Figure 2:
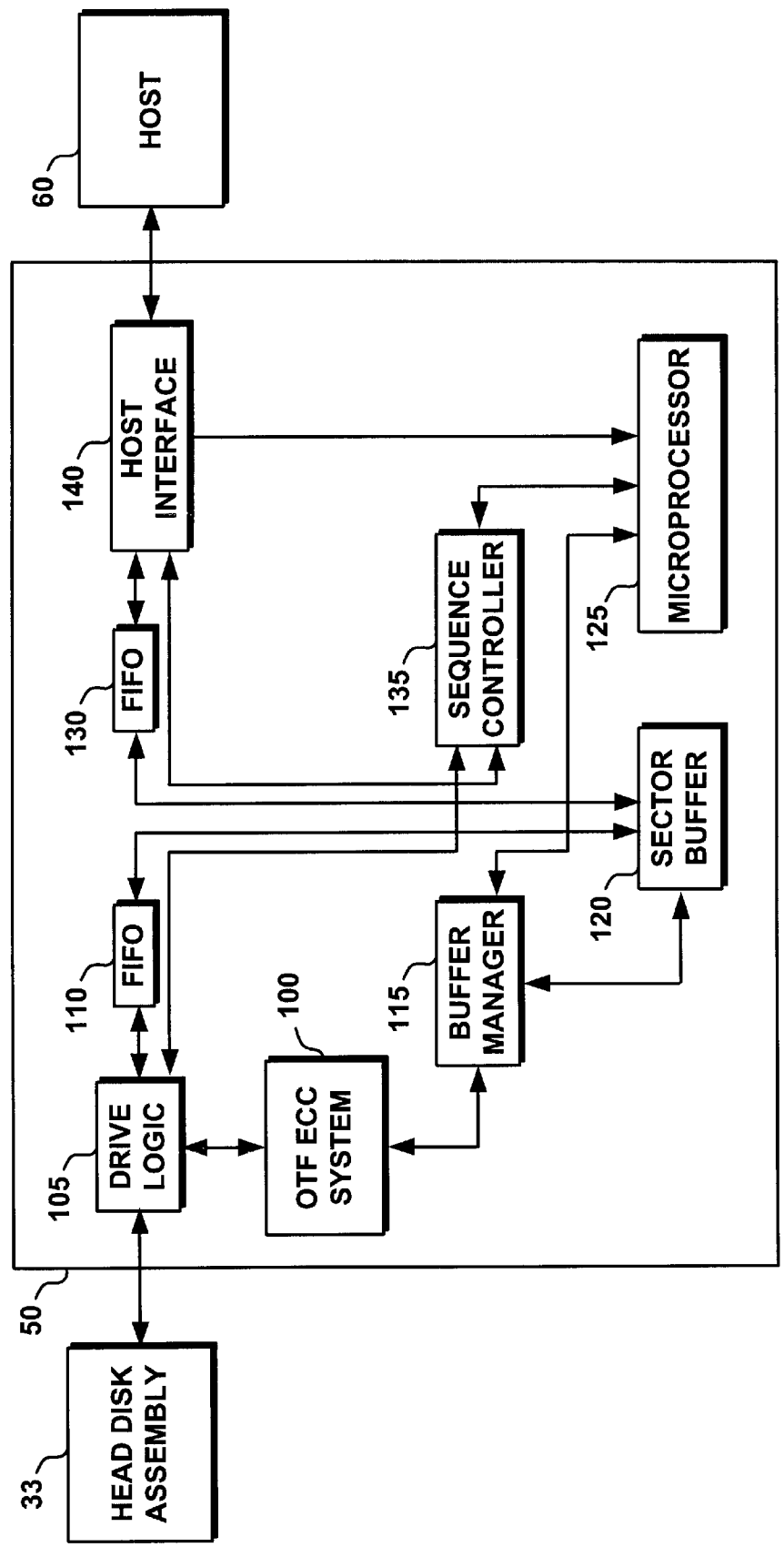
FIG. 2 is a block diagram detailing the architecture of a buffered hard disk controller that includes an on-the-fly (OTF) error correction code (ECC) system for implementing the on-the-fly error correction code according to the present invention.

FIG. 2 illustrates an exemplary architecture of a buffered hard disk controller 50 that comprises an on-the-fly (OTF) error correction code (ECC) system 100 for implementing the on-the-fly error correction code according to the present invention. It should be clear that the present invention is not limited to this specific architecture and that it can be implemented by, or in conjunction with other architectures.

The hard drive controller 50 includes a logic drive circuit 105 that formats data from the hard disk assembly 33, for example from 8 bits to 32 bits. A FIFO register 110 stores the formatted data and exchanges the same with a sector buffer 120. The ECC system 100 receives the formatted data from the drive logic circuit 105 and performs the error correction coding algorithm of the present invention, as described herein.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60 (FIG. 1).

Figure 3:
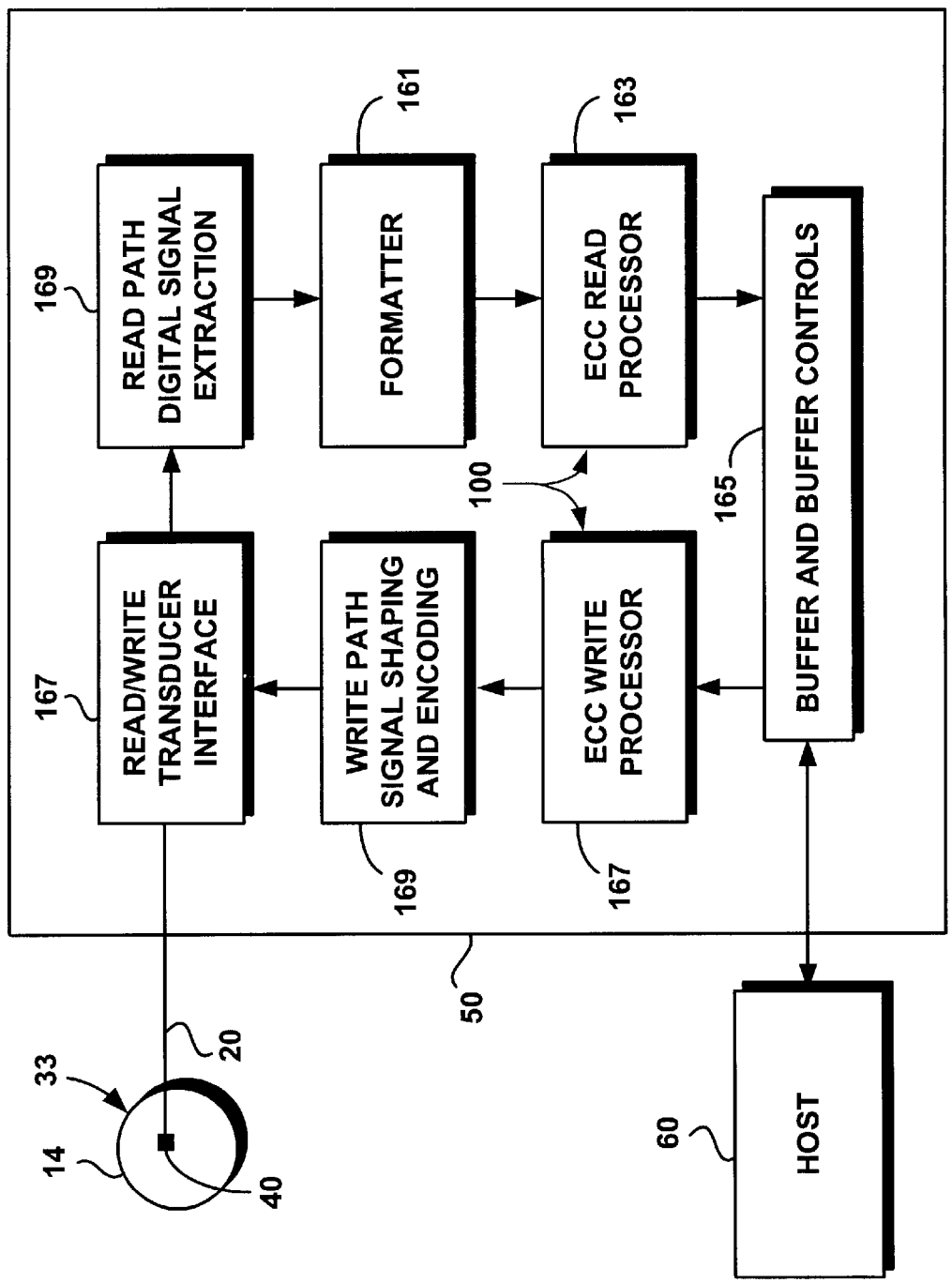
FIG. 3 is a block diagram of the data storage system of FIG. 1, depicting data flow along a read channel and a write channel of the hard drive controller of FIG. 2, and illustrating an exemplary on-the-fly error correction code system comprised of an ECC read processor and an ECC write processor.

FIG. 3 represents a block diagram of the hard disk controller 50 of FIG. 2 that includes an on-the-fly error correction code system 100 comprised of an ECC read processor 163 and an ECC write processor 167. When sequences of digital binary data are to be written onto the disk 14, they are placed temporarily in a buffer 165 and subsequently processed and transduced along a write path or channel (157, 167 and 169).

First, a predetermined number of binary data elements, also termed bytes, in a data string are moved from the buffer 165 and streamed through an ECC write processor 167. In the ECC write processor 167, the data bytes are mapped into codewords drawn from a Reed-Solomon code. Next, each codeword is mapped in a write path signal-shaping unit 169 into a run length limited or other bandpass or spectral-shaping code and changed into a time-varying signal. The write path signal-shaping unit 169 includes an encoder 202 (FIG. 4) for encoding the signals as described herein. The time-varying signal is applied through an interface read/write transducer interface 157 and thence to the write element in a magnetoresistive or other suitable transducer head 40 for conversion into magnetic flux patterns.

All the measures starting from the movement of the binary data elements from buffer 165 until the magnetic flux patterns are written on a selected disk track 42 (FIG. 1) as the rotating disk 14 passes under the head 40 are synchronous and streamed. For purposes of efficient data transfer, the data is destaged (written out) or staged (read) a disk sector at a time. Thus, both the mapping of binary data into Reed-Solomon codewords and the conversion to flux producing time-varying signals must be done well within the time interval defining a unit of recording track length moving under the transducer. Typical units of recording track length are equal fixed-length byte sectors of 512 bytes.

When sequences of magnetic flux patterns are to be read from the disk 14, they are processed in a read path or channel (157, 159, 161, and 163) and written into the buffer 165. The time-varying signals sensed by transducer 40 are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 11.

Since the read path is evaluating sequences of Reed Solomon codewords previously recorded on the disk 14, then, absent error or erasure, the codewords should be the same. In order to test whether that is the case, each codeword is applied to an ECC read processor 163 over a path from a formatter 161. Also, the output from the ECC processor 163 is written into buffer 165. The read path also operates in a synchronous datastreaming manner such that any detected errors must be located and corrected within the codeword well in time for the ECC read processor 163 to receive the next codeword read from the disk track 42. The buffer 165 and the read and write channels may be monitored and controlled by the microprocessor 125 (FIG. 2) to ensure efficacy where patterns of referencing may dictate that a path not be taken down, such as sequential read referencing.

Having described the general environment in which the ECC system 100 of the present invention operates, the error correction algebraic decoder (soft ECC decoder) 200, forming part of the ECC system 100 will now be described. Each of the ECC read processor 163 and the ECC write processor 167 includes an ECC decoder 200 that can be implemented in hardware using digital logic. The main components of the soft ECC decoder 200 are illustrated in FIG. 4.

The ECC system 100 (FIG. 4) includes several functional units such as the encoder 202, the preamplifier 44, the read/write channel 48, a syndrome generator 205, and a key equation solver that contains the soft ECC decoder 200 of the present invention. In operation, the byte reliability generator 49 calculates the byte reliabilities of the codewords. As used herein, byte reliability is an indication of the accuracy of the codeword, and is comprised of two components: byte reliability numbers 410, and candidate erasure locations 420.

Figure 4:
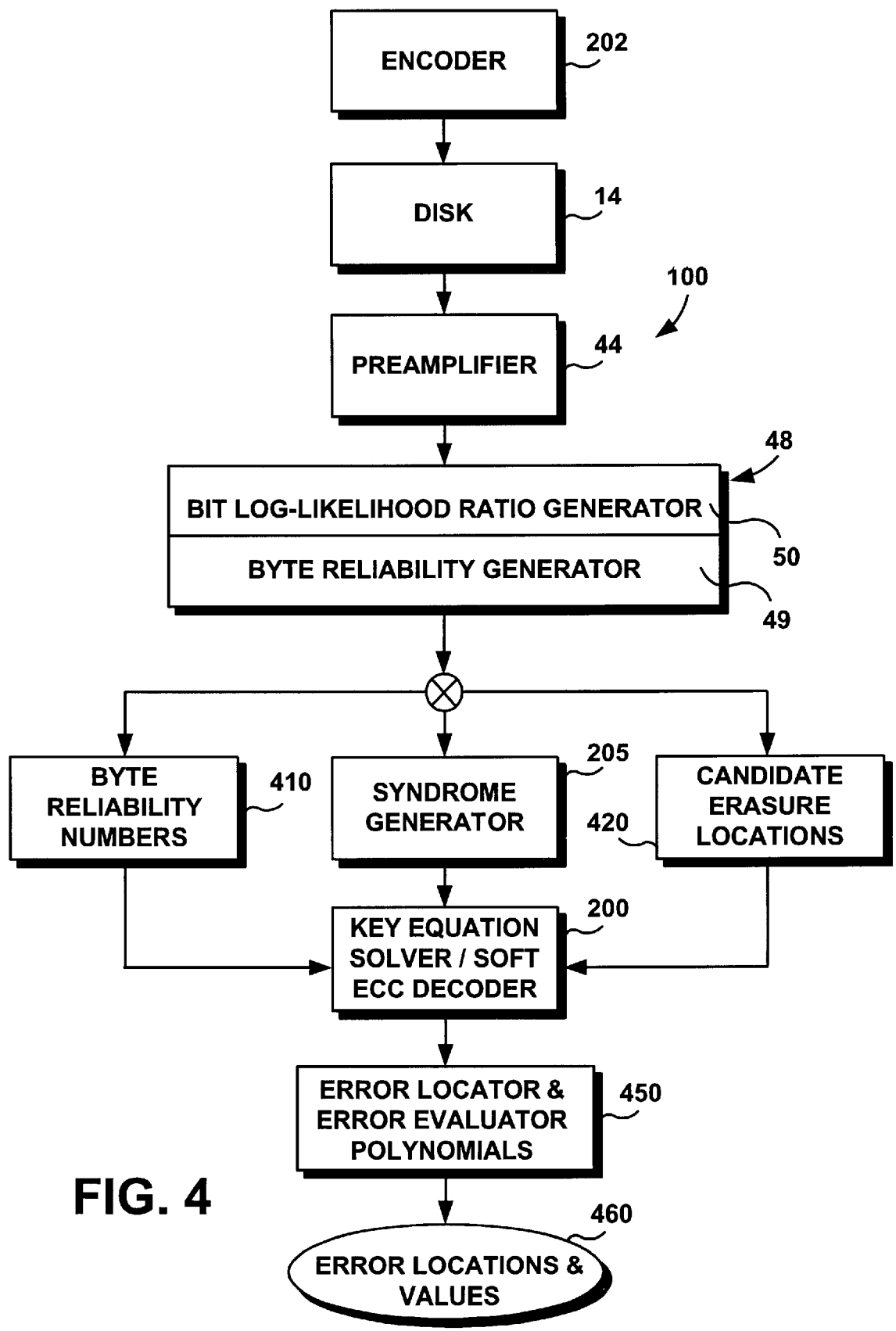
FIG. 4 is a block diagram of the data storage system of FIG. 1, detailing the main components of an error correction code module that forms part of the ECC read processor and the ECC write processor of FIG. 3.

Referring to FIG. 4, the read/write channel 48 includes a bit log-likelihood ratio generator 50 that generates a bit log-likelihood ratio (LLR) indicating the probability of a bit being either a "0" or a "1", as depicted by the following formula:

$$\text{LLR} = \log \frac{\text{probability of a bit being a ``1''}}{\text{probability of a bit being a ``0''}}.$$

The log-likelihood ratio generator 50 determines the LLR for each bit in the byte and identifies the bit with the minimum LLR as the byte reliability. The minimum bit LLR is set as the byte reliability number ($\theta_i$) for the particular byte, as follows:

$$\theta_i = \text{minimum } LLR_{i, j}, \text{ where: } 1 \leq j \leq 8.$$

An effective means for optimizing the erasure candidate locations by means of byte reliability calculations is to select local minimum reliability byte locations conditioned on a parity check failure. This assumes the usage of an inner parity check code in the read/write channel 48. The read/write channel 48 uses the inner parity check code to provide parity check flags. In one embodiment, the parity flag is derived from a one-bit parity check for a set of bytes, for example every 8 consecutive bytes.

The byte reliability generator 49 uses parity checks to detect the candidate erasure locations ($e_i$). If the byte reliability generator 49 determines that the parity of the set of bytes has failed, the byte reliability generator 49 selects the candidate erasure location ($e_i$) of the byte with the minimum $\theta_i$ within the set of bytes.

This selection rule can be further refined. According to another embodiment, the byte reliability generator 49 further calculates the reliability ratio, that is the ratio of two byte reliability numbers ($\theta_i$, $\theta_j$) that are contiguous in the ascending value order, as follows:

$$\text{Reliability ratio} = \theta_i / \theta_j.$$

If the reliability ratio is less than a predetermined threshold value, which is programmable, the byte reliability generator 49 selects the candidate erasure locations ($e_i$, $e_j$) of the bytes corresponding to the pair of byte reliability numbers ($\theta_i$, $\theta_j$).

For each codeword, the byte reliability generator 49 calculates a series of the reliability numbers ($\theta_n$), one for each byte, and further provides the locations of candidate erasures, i.e., the bytes with the least reliability. The syndrome generator 205 calculates the syndromes for the entire codeword and forwards them to the soft ECC decoder 200 of the key equation solver.

As explained herein, the soft ECC decoder 200 uses the byte reliability numbers 410, the candidate erasure locations 420, and the syndromes generated by the syndrome generator 205 to generate error locator and evaluator polynomials 450. In turn, the error locator and evaluator polynomials 450 are solved to generate the error locations and values 460 as described for example in U.S. Pat. No. 5,428,628 to Hassner et al., which is assigned to the same assignee as the present invention, and which is incorporated herein by reference.

The operation of the soft ECC decoder 200 will now be described in connection with FIGS. 5 through 11 in view of a specific example, for the purpose of illustration and not limitation. The soft ECC decoder 200 receives the syndromes 405 (FIG. 9), the byte reliability numbers 410 (FIG. 7), and the candidate erasure locations 420 (FIG. 8). At this initialization stage, the soft ECC decoder 200 selects the (d−1) least reliable locations and then sorts them in descending order (FIG. 10), so that the most reliable bytes are listed first. In this example, the byte at location number 1 has the largest value reliability number and is listed first, followed by the byte at location number 8, and so forth.

Similarly, the locations of the corresponding candidate erasures are also listed in the same order (FIG. 11) as the byte reliability numbers 410. In this example, the byte at location number 1 having the largest value reliability number has a Galois Field location index $a^1$ and is followed by the byte at location number 8 with a Galois Field location index $a^8$, and so forth, where "a" is a primitive element for the Galois Field.

For a t-byte soft ECC decoder 200, that is for a decoder capable of locating t errors, and having a Hamming distance (d=2t+1), the amount of disk storage required to execute the decoding algorithm of the present invention is (12t+6), detailed as follows:

Inputs
  2t registers to store the syndromes (FIG. 9);
  2t registers to store the sorted byte reliability numbers (FIG. 10); and
  2t registers to store the sorted candidate erasure locations (FIG. 11).

Working Storage
  2t registers to store the coefficients of an error evaluator polynomial;
  2t registers to store the coefficients of an auxiliary error evaluator;
  2t registers to store the error evaluator polynomial of the best solution; and
  6 registers to store the following parameters (one register for each parameter):
    $\delta$: control variable that controls the flow of the decoding algorithm described herein;
    $\theta_{sum}$: performance criterion;
    $\theta_{best}$: best value of the performance criterion $\theta_{sum}$;
    $\delta_{min}$: minimum value of the control variable $\delta$;
    $\gamma$: value of an error evaluator polynomial at the erasure location; and
    $\eta$: value of an auxiliary error evaluator polynomial at the erasure location.

Figure 5A:
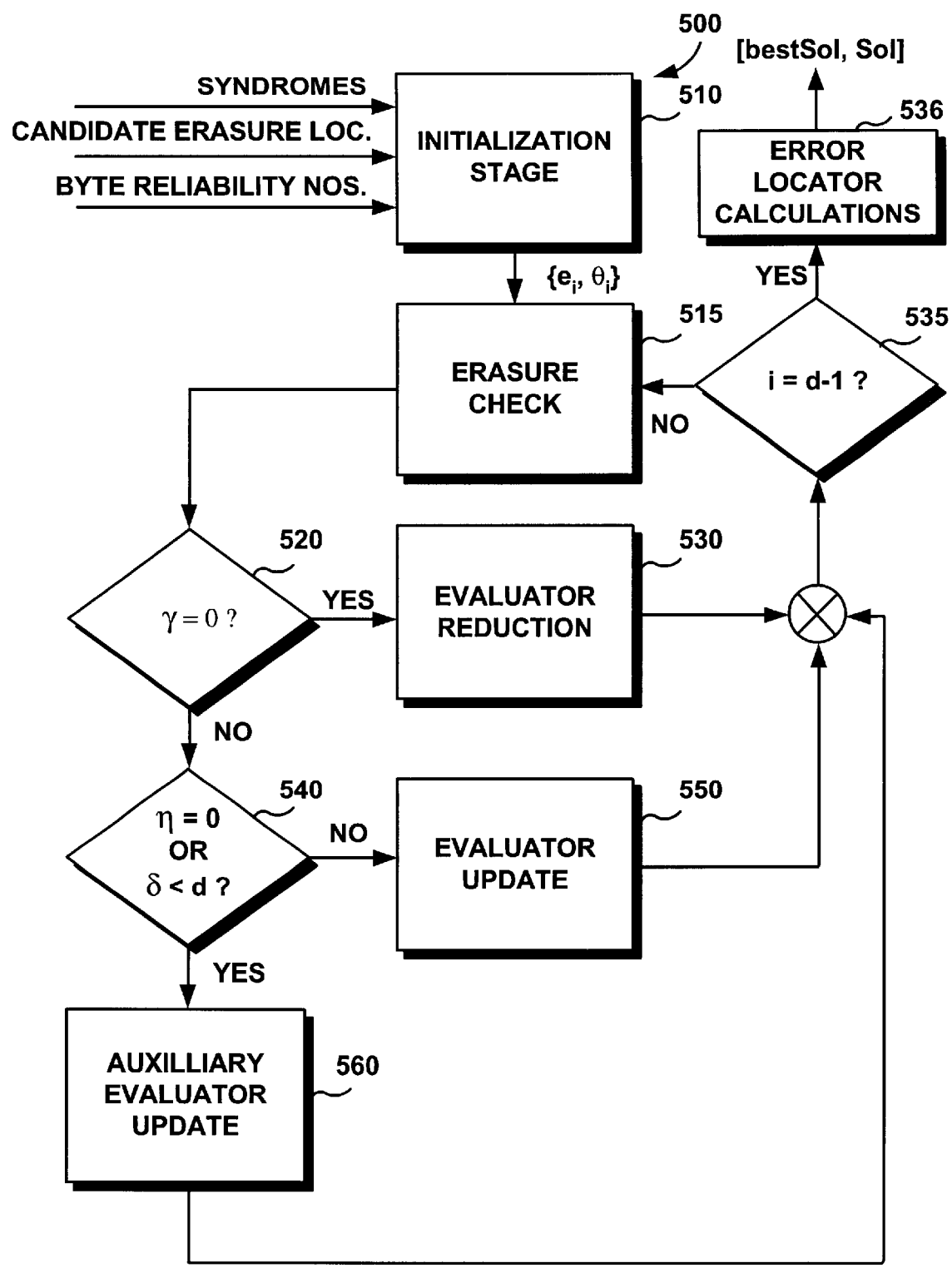
FIG. 5A is a functional flow chart that illustrates a general method for implementing an error correction code by means of a soft error correction decoder used in the data storage system of FIG. 4.
Figure 5B:
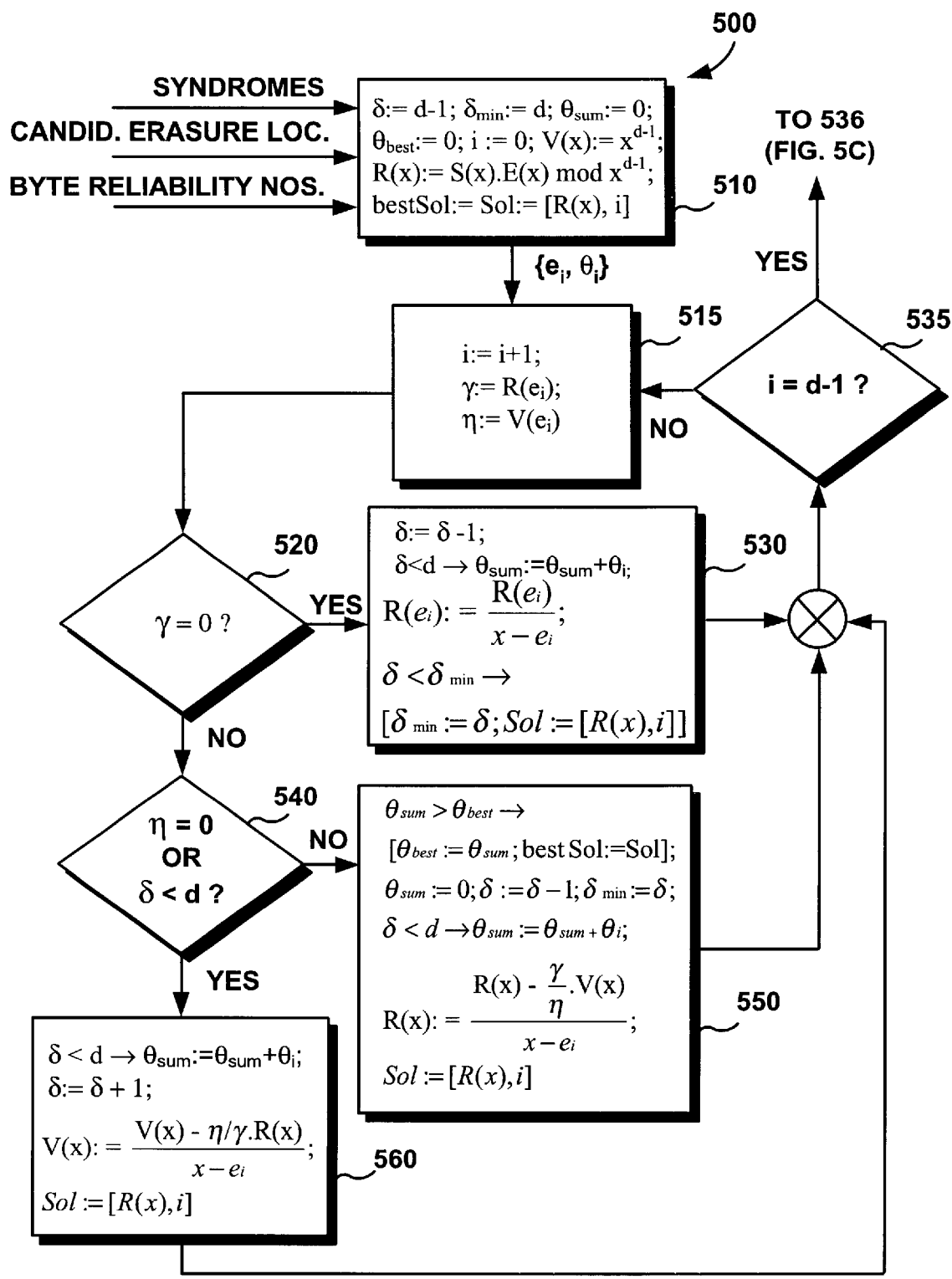
FIG. 5B is a functional flow chart of a specific example of the error correction code method of FIG. 4.

For illustration purpose, in the example of FIGS. 9–11, t=4, and the number of registers required for the decoding process 500 of FIGS. 5A and 5B is 48 registers [i.e., (12*4)+6 ].

For the t-byte soft decoder 200, the total number of iterations (d−1) required to complete the decoding process 500 is defined by the following equation:

$$\text{Total Latency} = 2t + 4\left[\sum_{k=0}^{t}(2t-k)\right],$$

where k is an index ranging from zero to t.

FIGS. 5A and 5B illustrate a decoding process 500 implemented by the soft ECC decoder 200 of the present invention. At step 510 the soft ECC decoder 200 starts by initializing two polynomials V(x) and R(x), where: V(x) is the auxiliary evaluator polynomial initialized by the following equation:

$$V(x) := x^{d-1};$$

and

R(X) is an error evaluator polynomial initialized by the following equation:

$$R(x) := S(x).E(x) \bmod x^{d-1},$$

where S(x) is the syndrome polynomial determined by the syndrome values; and E(x) is the erasure polynomial whose roots are the candidate erasure locations.

In addition, at step 510 the soft ECC decoder 200 initializes the following parameters to preset base values, as follows:

$\delta := d-1$, where $\delta$ is the sum of twice the number of errors plus the number of erasures for the current solution, and controls the flow of the decoding method 500 by comparing its value to d, the Hamming distance of the code.
  $\delta_{min} := d$, where $\delta_{min}$ is the minimum value of $\delta$ in the current computational block.
  $\theta_{sum} := 0$, where $\theta_{sum}$ is the performance criterion of the current computational block.
  $\theta_{best} := 0$, where $\theta_{best}$ is the best current maximum value of $\theta_{sum}$ in a computational block.
  i := 0, where i is the number of iterations executed by the method 500.
  bestSol:=Sol:=[R(x), i], where bestSol is the solution associated with the current $\theta_{best}$, and Sol is the most recently calculated.

The object of steps 515, 520 and 540 which will now be described in detail is to check if the candidate erasure being assessed is a true error. This goal is achieved by processing the sorted byte reliability numbers of FIG. 10 and the corresponding sorted candidate erasure locations of FIG. 11, sequentially, one pair $\{e_i, \theta_i\}$ at a time, in a descending order, that is starting with the most reliable processed first.

At step 515, the number of iterations i is incremented by one unit (i=i+1), and each pair $\{e_i, \theta_i\}$ is evaluated by calculating the two corresponding polynomials V($e_i$) and R($e_i$), where $e_i$ represents the candidate erasure location, and $\theta_i$ represents the corresponding byte reliability number being currently analyzed.

Also at step 515, the soft ECC decoder 200 evaluates the following expressions:

$\gamma := R(e_i);$ $\eta := V(e_i).$

At step 520 the soft ECC decoder 200 checks if the value of $\gamma$, that is the error evaluator polynomial at the candidate erasure location ($e_i$) being analyzed, is zero. If the soft ECC decoder 200 determines at step 520 that the value of $\gamma$ is zero, it proceeds to the evaluator reduction step 530, where it discards the candidate erasure from further consideration as a false error. This is accomplished by evaluating the following expressions:

$\delta := \delta - 1;$ $\delta < d \rightarrow \theta_{sum} := \theta_{sum} + \theta_i;$ $R(e_i) := \dfrac{R(e_i)}{x - e_i};$ $\delta < \delta_{min} \rightarrow [\delta_{min} := \delta; \text{Sol} := [R(x), i]].$ As it can be seen from the above expression of $R(e_i)$, dividing the error evaluator polynomial $R(e_i)$ by the linear term ($x - e_i$) reduces (i.e., removes) the candidate erasure from further consideration.

The process 500 then inquires at step 535 if all the sorted byte reliability numbers (FIG. 10) and the sorted candidate erasure locations (FIG. 11) have been considered. If they have, the soft ECC decoder 200 calculates the error location polynomial at step 536, and generates the best solution and the current solution: [bestSol, Sol] therefrom, as it will be described later in connection with FIG. 5C.

If the decoding method 500 determines at step 535 that some of the sorted byte reliability numbers and the sorted candidate erasure locations have not been considered, the process 500 proceeds to step 515 where it accepts the next pair $\{e_i, \theta_i\}$ of candidate erasure location and byte reliability number. The new pair $\{e_i, \theta_i\}$ is then processed as described herein.

Returning to step 520, if the decoding method 500 determines that the value $\gamma$, of the error evaluator polynomial $R(e_i)$ at the candidate erasure location ($e_i$) being analyzed, is different from zero, it proceeds to step 540 where it inquires if the value $\eta$ of the auxiliary evaluator polynomial V(x) for the pair $\{e_i, \theta_i\}$ of candidate erasure location and byte reliability number being currently analyzed is zero, i.e., $V(e_i) = 0$. Also at step 540, the soft ECC decoder 200 further checks if the degree bound $\delta$ is less than the Hamming distance d.

If neither condition is determined at step 540 to be satisfied, that is if $\eta$ is not equal to zero and $\delta$ does not satisfy the bound condition (i.e., $\delta$ is not less than the Hamming distance), then the process 500 proceeds to the evaluator update step 550 where it treats the current candidate erasure as an actual error and updates the best solution bestSol, as indicated by the following expressions:

$\theta_{sum} > \theta_{best} \rightarrow [\theta_{best} := \theta_{sum}; \text{bestSol} := \text{Sol}];$ $\theta_{sum} := 0;$ $\delta := \delta - 1;$ $\delta_{min} := \delta;$ $\delta < d \rightarrow \theta_{sum} := \theta_{sum} + \theta_i;$ $R(x) := \dfrac{R(x) - \dfrac{\gamma}{\eta} \cdot V(x)}{x - e_i};$ $\text{Sol} := [R(x), i].$ The method 500 then returns to step 535 and proceeds with the inquiry as described earlier.

Returning to step 540, if the decoding method 500 determines that both conditions are satisfied, that is if $\eta$ is equal to zero and $\delta$ satisfies the bound condition (i.e., $\delta$ is less than the Hamming distance), then the process 500 proceeds to the auxiliary evaluator update step 560 where it updates the auxiliary evaluator polynomial V(x) and the best solution bestSol, as indicated by the following expressions:

$\delta < d \rightarrow \theta_{sum} := \theta_{sum} - \theta_i;$ $\delta := \delta + 1;$ $V(x) := \dfrac{V(x) - \eta / \gamma \cdot R(x)}{x - e_i};$ $\text{Sol} := [R(x), i].$ The method 500 then returns to step 535 and proceeds with the inquiry as described above.

Figure 5C:
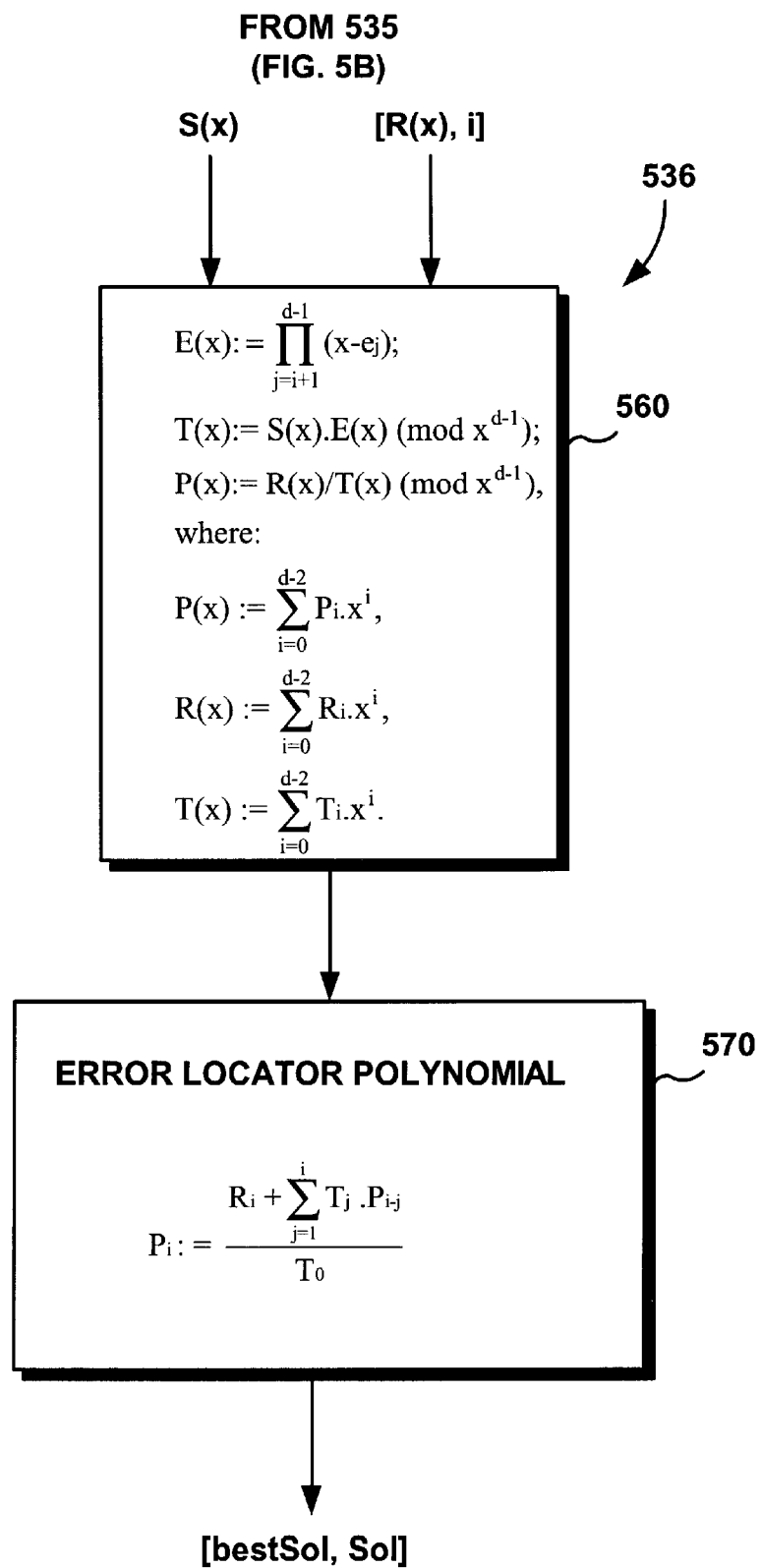
FIG. 5C is a flow chart that explains a step of calculating an error locator polynomial for use in the error correction method of FIGS. 5A and 5B.

Turning to FIG. 5C, the decoding process 500, knowing the syndromes S(x), the error evaluator polynomial R(x) and the index i, calculates the error locator polynomial P(x) by evaluating the following expressions at step 560:

$E(x) := \prod_{j=i+1}^{d-1} (x - e_j);$ $T(x) := S(x) E(x) \pmod{x^{d-1}};$ $P(x) := R(x)/T(x) \pmod{x^{d-1}},$ where:

$P(x) := \sum_{i=0}^{d-2} P_i \cdot x^i,$ $R(x) := \sum_{i=0}^{d-2} R_i \cdot x^i,$ $T(x) := \sum_{i=0}^{d-2} T_i \cdot x^i.$ The error locator polynomial coefficients $P_i$ are then computed iteratively, for $0 \leq i \leq d-2$, as follows at step 570:

$P_i := \dfrac{R_i + \sum_{j=1}^{i} T_j \cdot P_{i-j}}{T_0}.$

Following the foregoing decoding process 500, the soft ECC decoder 200 ultimately generates the best solution and the current solution, [bestSol, Sol] using techniques that are available or known in the field.

It is to be understood that the specific embodiments of the invention that have been described are merely illustrative of certain application of the principle of the present invention. Numerous modifications may be made to the error correcting system and associated method described herein, without departing from the spirit and scope of the present invention. Moreover, while the present invention is described for illustration purpose only in relation to a data storage system, it should be clear that the invention is applicable as well to various communications and data processing systems.

What is claimed is:

1. An error correction code system comprising:

a byte reliability generator that calculates byte reliabilities of a codeword;

a syndrome generator for generating one or more syndromes for the codeword; and a key equation solver including a decoder for iteratively processing the byte reliabilities and the syndromes to generate Generalized Minimum Distance decoding error locator polynomial and error evaluator polynomial therefrom.

2. The system according to claim 1, wherein the byte reliabilities are comprised of two components: byte reliability numbers, and candidate erasure locations.

3. The system according to claim 2, wherein the byte reliability generator calculates a plurality of reliability numbers, one for each byte of the codeword, and further provides the locations of candidate erasures having the least reliability numbers.

4. The system according to claim 3, wherein the decoder initializes a plurality of parameters at an initialization stage.

5. The system according to claim 4, wherein, at the initialization stage, the decoder selects (d−1) least reliable bytes, where d represents a Hamming distance, and sorts the selected bytes in descending order so that most reliable bytes are processed first.

6. The system according to claim 5, wherein, at the initialization stage, the decoder further sorts the locations of candidate erasures that correspond to the byte reliability numbers.

7. The system according to claim 4, wherein for a t-byte decoder, the decoder performs a total number of (d−1) iterations, where d represents a Hamming distance.

8. The system according to claim 7, wherein the decoder has a latency defined by the following equation:

$$\text{Total Latency} = 2t + 4\left[\sum_{k=0}^{t}(2t-k)\right],$$

where k is an index ranging from zero to t.

9. The system according to claim 4, wherein the decoder initializes any one or more of:

an auxiliary evaluator polynomial V(x) initialized by the following equation: $V(x):=x^{d-1}$, where d is a Hamming distance; or an error evaluator polynomial initialized by the following equation: $R(x):=S(x).E(x) \bmod X^{d-1}$, where S(x) is a syndrome polynomial determined by syndrome values, and E(x) is an erasure polynomial determined by the candidate erasure locations.

10. The system according to claim 9, wherein the decoder initializes any one or more of the following parameters:

d:=d−1;

$d_{min}:=d$, where $d_{min}$ is a minimum value of d in a current computational block;

$q_{sum}:=0$, where $q_{sum}$ is a measure of the current computational block;

$q_{best}:=0$, where $q_{best}$ is a best current maximum value of $q_{sum}$ in a computational block;

i:=0, where i is the number of iterations executed by the decoder; or bestSol:=Sol:=[R(x), i], where bestSol is a best solution associated with a current $q_{best}$, and Sol is a most recently calculated solution.

11. The system according to claim 9, wherein the decoder further sequentially performs a candidate erasure check to assess whether the candidate erasure is a true error, one candidate erasure at a time.

12. The system according to claim 11, wherein the decoder evaluates the following expressions:

$$g:=R(e_i);$$

$$h:=V(e_i),$$

where $e_i$ is the value of an ith candidate erasure location;

wherein the decoder further inquires if the value of g, that is the error evaluator polynomial at the candidate erasure location ($e_i$) being analyzed, is zero;

wherein if the decoder determines that the value of g is zero, the decoder proceeds to an evaluator reduction stage where the decoder discards the candidate erasure from further consideration as a false error.

13. The system according to claim 12, wherein if the decoder determines that the value g of the error evaluator polynomial $R(e_i)$ at the candidate erasure location ($e_i$) being analyzed is different from zero, the decoder inquires if the value h of the auxiliary evaluator polynomial V(x) at the candidate erasure location and byte reliability number being currently analyzed is zero $V(e_i):=0$, and further checks if d satisfies a bound condition whereby a degree bound d is less than the Hamming distance d.

14. The system according to claim 13, wherein if the decoder determines that h is not equal to zero and that d does not satisfy the bound condition, then the decoder proceeds to an evaluator update stage where the decoder treats the current candidate erasure as an actual error and updates the best solution (bestSol).

15. The system according to claim 14, wherein if the decoder determines that h is equal to zero and that d satisfies the bound condition, then the decoder proceeds to an auxiliary evaluator update stage where it updates the auxiliary evaluator polynomial V(x) and the best solution (bestSol).

16. An error correction code method comprising:

calculating byte reliabilities of a codeword;

generating one or more syndromes for the codeword; and iteratively processing the byte reliabilities and the syndromes to generate Generalized Minimum Distance decoding error locator polynomial and error evaluator polynomial therefrom.

17. The method according to claim 16, wherein the byte reliabilities are comprised of two components: byte reliability numbers, and candidate erasure locations; and wherein calculating a byte reliability of the codeword includes calculating a plurality of reliability numbers, one for each byte of the codeword, and further providing the locations of candidate erasures having the least reliability numbers.

18. The method according to claim 17, wherein the step of processing includes initializing a plurality of parameters at an initialization stage.

19. The method according to claim 18, wherein the step of processing further includes sequentially performing a candidate erasure check to assess whether the candidate erasure is a true error.

20. The method according to claim 19, wherein the step of performing a candidate erasure check includes setting the following expressions:

$$g:=R(e_i);$$

$$h:=V(e_i),$$

where $e_i$ is the value of an ith candidate erasure location; and
further inquiring if the value of g, that is the error evaluator polynomial at the candidate erasure location ($e_i$) being analyzed, is zero; and
wherein if the value of g is zero, performing an evaluator reduction step by discarding the candidate erasure from further consideration as a false error.

21. The method according to claim 20; wherein if the value g of the error evaluator polynomial $R(e_i)$ at the candidate erasure location ($e_i$) being analyzed is different from zero, inquiring if the value h of the auxiliary evaluator polynomial V(x) at the candidate erasure location and byte reliability number being currently analyzed is zero $V(e_i):=0$, and further inquiring if d satisfies a bound condition whereby a degree bound d is less than the Hamming distance d;

wherein if h is not equal to zero and d does not satisfy the bound condition, then performing an evaluator update step by treating the current candidate erasure as an actual error and updating the best solution (bestSol); and if h is equal to zero and d satisfies the bound condition, then performing an auxiliary evaluator update step by updating the auxiliary evaluator polynomial V(x) and the best solution (bestSol).

22. The method according to claim 17, wherein the step of initializing includes:
sorting the byte reliability numbers so that the least reliable bytes are
processed first; and
sorting the locations of candidate erasures that correspond to the byte reliability numbers.

23. The method according to claim 22, wherein the step of initializing includes initializing any one or more of:

an auxiliary evaluator polynomial V(x) initialized by the following equation: $V(x):=x^{d-1}$, where d is a Hamming distance;

an error evaluator polynomial initialized by the following equation: $R(x):=S(x).E(x) \mod x^{d-1}$, where S(x) is a syndrome polynomial determined by syndrome values, and E(x) is an erasure polynomial determined by the candidate erasure locations;

d:=d−1;

$d_{min}:=d$, where $d_{min}$ is a minimum value of d in a current computational block;

$q_{sum}:=0$, where $q_{sum}$ is a measure of the current computational block;

$q_{best}:=0$, where $q_{best}$ is a best current maximum value of $q_{sum}$ in a computational block;

i=0, where i is the number of iterations executed by the decoder; or bestSol:=Sol:=[R(x), i], where bestSol is a best solution associated with a current $q_{best}$, and Sol is a most recently calculated solution.

24. The method according to claim 17, wherein calculating the byte reliability includes using a parity check to detect the candidate erasure locations.

25. The method according to claim 16, wherein iteratively processing the byte reliabilities includes integrating finite field and finite precision arithmetic in a single recursion.

26. The method according to claim 16, wherein calculating the byte reliability includes generating the byte reliability from a bit log-likelihood ratio.

27. The method according to claim 26, wherein calculating the byte reliability includes selecting a byte reliability with a minimum bit log-likelihood ratio.

28. The method according to claim 27, wherein calculating the byte reliability includes using a parity check to detect the candidate erasure locations.

29. The method according to claim 17, wherein calculating the byte reliability includes calculating a reliability ratio of two consecutive byte reliability numbers in an ascending value order; and if the reliability ratio is less than a predetermined threshold value, selecting the candidate erasure locations of the bytes corresponding to the pair of consecutive byte reliability numbers.

* * * * *